US006536007B1

(12) United States Patent
Venkataraman

(10) Patent No.: US 6,536,007 B1
(45) Date of Patent: Mar. 18, 2003

(54) MODELS AND TECHNIQUE FOR AUTOMATED FAULT ISOLATION OF OPEN DEFECTS IN LOGIC

(75) Inventor: Srikanth Venkataraman, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 373 days.

(21) Appl. No.: 09/608,718

(22) Filed: Jun. 30, 2000

(51) Int. Cl.[7] ............................................... G01R 31/28
(52) U.S. Cl. ....................... 714/724; 714/726; 714/727; 714/732; 714/733; 324/765; 365/201
(58) Field of Search ................................. 714/724, 727, 714/733, 726, 732, 30; 324/751, 501, 765; 365/201

(56) References Cited

U.S. PATENT DOCUMENTS 4,801,869 A * 1/1989 Sprogis ...................... 714/733
5,303,246 A * 4/1994 Anderson et al. ........... 714/727
5,825,785 A * 10/1998 Barry et al. ................. 714/732
5,959,459 A * 9/1999 Satya et al. ................. 324/751
6,158,033 A * 12/2000 Wagner et al. .............. 714/726

* cited by examiner

Primary Examiner—Emmanuel L. Moise
(74) Attorney, Agent, or Firm—Blakely, Sokoloff, Taylor & Zafman LLP

(57) ABSTRACT

A method and system for diagnosing open defects in logic circuits. The method employs a pair of diagnostic fault models and an associated algorithm to automate the diagnoses of open defects—defects that cause interconnects to be open or high resistance in logic. The two diagnostic fault models, the net and node models, are used to predict potential logic errors that could be caused at the outputs of a logic circuit in the presence of an open defect on any interconnect under consideration in the logic circuit. The predicted errors are combined to form a diagnostic signature set corresponding to the logic circuit. The diagnostic signature set is then compared with a set of errors observed during testing using a diagnostic matching algorithm that ranks the presence of open defects on all interconnects under consideration in the circuit.

18 Claims, 4 Drawing Sheets

MODELS AND TECHNIQUE FOR AUTOMATED FAULT ISOLATION OF OPEN DEFECTS IN LOGIC

BACKGROUND OF THE INVENTION

1. Field of the Invention

The present invention generally concerns verification of logic in semiconductor devices, and, in particular, concerns automated techniques for isolation of logic faults.

2. Background Information

Fault isolation (FI) is essential in the production of modern integrated circuits. FI is used at different stages of the product cycle, including silicon debug, fabrication yield improvement and Low Yield Analysis, and customer returns. During the manufacturing process, there are many anomalies that can occur, resulting in logic faults known as open defects. Open defects cause interconnects between logic elements to be open or have high resistance, and occur due to manufacturing problems that cause missing conducting material or poorly formed vias and contacts, or due to reliability issues like thermal stress or electromigration. Open defects constitute a significant fraction of manufacturing defects. More importantly, open defects are hard to test and isolate, and have been the source of major yield issues (e.g., salicide cracking, missing vias, spongy vias and oval contacts) for semiconductor manufacturers. Thus efficient isolation or diagnosis of such defects plays a very important role in fabrication yield improvement and in identifying reliability issues during the qualification of products. The requirement for efficient diagnosis of open defects will become increasingly more critical with newer :,process technologies pushing the envelope on a number of metal layers.

Presently, the problem of diagnosing open defects is generally solved by two means. Conventional techniques that are currently deployed for random logic fault isolation include a combination of physical techniques (e.g., emission microscope and liquid crystal) and functional pattern analysis using a combination of RTL simulation, manual deductive reasoning and e-beam/laser voltage probing. This approach requires micro-architectural knowledge to analyze functional patterns and generally takes a long throughput (e.g., four or more weeks). Furthermore, success rates of physical techniques are reducing with increasing density, multiple metal layers and flip-chip packaging. In addition, alternative approaches that automatic the process of isolation using just the simple single stuck-at fault model has the disadvantage of low accuracy and imprecise isolation.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE ILLUSTRATED EMBODIMENTS

The present invention comprises a technique that includes diagnostic fault models and an associated algorithm to automate the diagnosis of open defects (a.k.a., open fault)—that is defects that cause interconnects to be open or have high resistance in logic. Two diagnostic fault models, the node and net models, are used to predict potential logic errors that could be caused at the outputs of a logic circuit in the presence of an open fault on any interconnect under consideration in the circuit. Typically, the output of the logic circuit could either be the bond pads of a chip or observable points within an integrated circuit, such as scan nodes, scanout nodes or memory arrays that are directly accessible during testing. The predicted errors are compared with actual errors observed during testing of the circuit using a diagnostic matching algorithm that ranks the presence of open defects on all interconnects under consideration in the circuit.

Figure 1A:
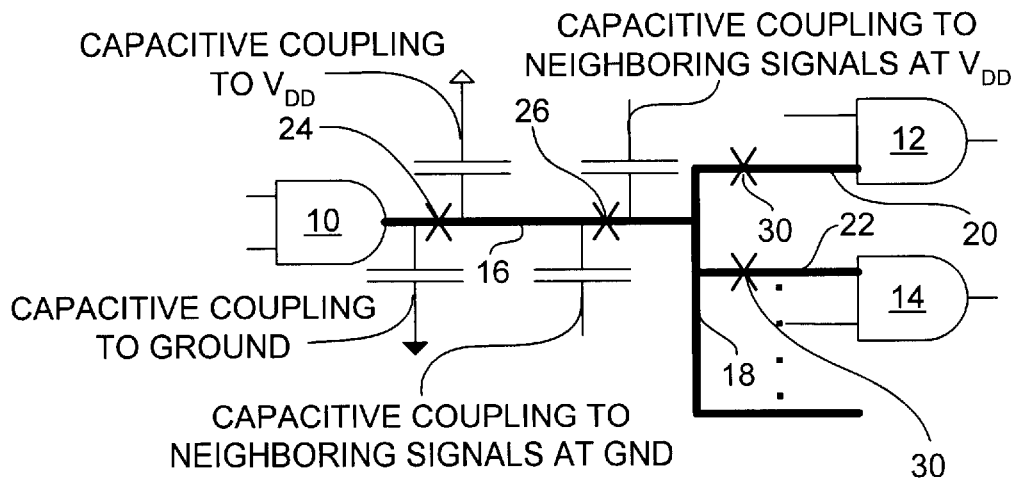
FIG. 1A is a schematic diagram of a logic circuit illustrating various types of behaviors leading to logic errors that may be caused by signal coupling effects in the presence of open defects in logic circuits.

The problem of determining the logic behavior of an open interconnect is a difficult one, as illustrated by the simple logic circuit shown in FIG. 1A. The logic circuit includes AND gates 10, 12, and 14, which are electrically by interconnect lines 16, 18, 20, and 22. Ideally, signals at the outputs and inputs of the AND gates would pass through appropriate interconnect lines with no disturbance. However, under an open fault condition, a signal may not pass through properly (i.e., not pass through at all, or pass through at a different logic level than the signal was when it left the previous gate. The logic value of the signal under an open fault is a function of the location of the defect, its resistance, and the capacitive coupling of the signal line to power and ground signals lines and other neighboring signal lines at logic 1 ($V_{DD}$) or logic 0 (GND). For example, the behavior of an open fault at locations 24, 26, 28, and 32 along the interconnect circuitry, as depicted in the Figure, may be different. This makes the problem of accurately simulating an open fault very difficult.

Figure 1B:
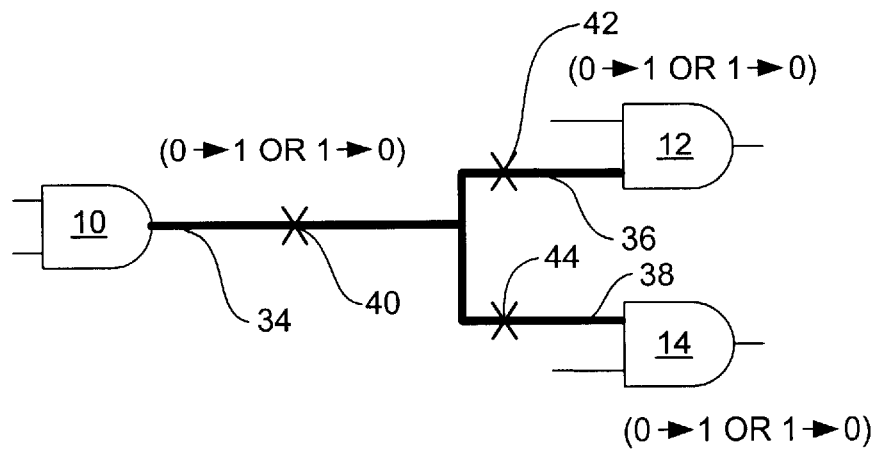
FIG. 1B is a schematic diagram corresponding to a logic error model of an open node in accord with the present invention.

The present invention circumvents the problem of accurately simulating the behavior of open faults through the use of two diagnostic fault models, including a node model and a net model. With respect to the net model, consider the interconnect shown in FIG. 1B. The logic description includes a stem 34 and two branches 36 and 38, each of which may comprise a respective open fault 40, 42, and 44. Under the application of a test vector, the only possible erroneous logic behaviors are a 0/1 error (expected circuit logic value of 0, with an erroneous circuit value of 0) or a 1/0 error (erroneous circuit logic value of 1, with an expected circuit value of 0) on either the stem or one or more of the branches of an interconnect that is faulty. All potential errors that can be caused on the outputs (or observation points) of a logic circuit in the presence of an open defect on an interconnect are captured through simulation by the use of two diagnostic fault models (the node and the net model), which are respectively illustrated in FIGS. 2 and 3.

Figure 2:
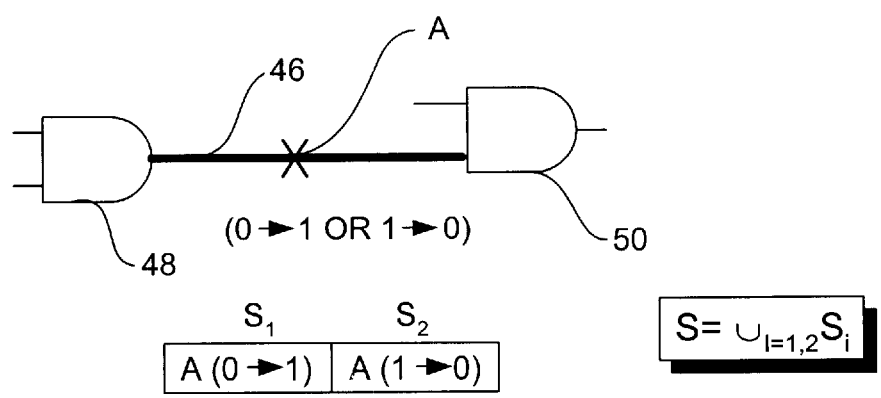
FIG. 2 is a schematic diagram corresponding to the node diagnostic fault model of the present invention.
Figure 3:
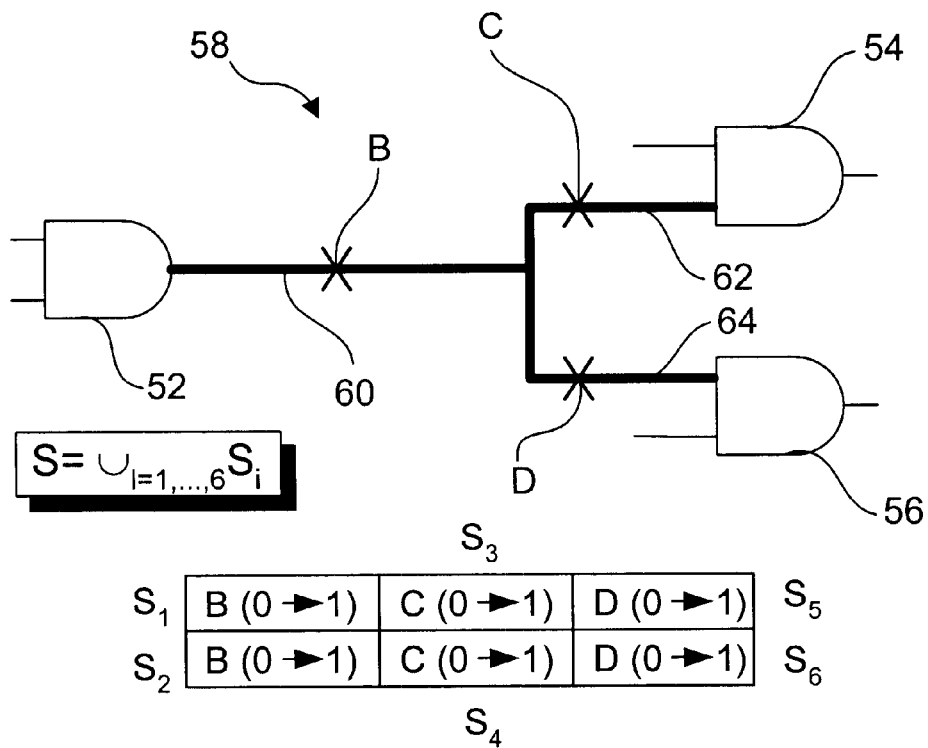
FIG. 3 is a schematic diagram corresponding to the net diagnostic fault model of the present invention.

The node model covers open defects on interconnect lines without fanout. For example, consider the case of a missing via on a fabricated chip. An open defect on that node (i.e., signal line) may manifest itself as a stuck-at-0 or a stuck-at-1 error depending on the electrical characteristics of the circuit and the defect. Given a test sequence, both stuck-at faults may be detected on the node for different test vectors, but both faults will not be produced by a single test vector. Therefore, neither stuck-at fault will describe all failures observed on a defective chip comprising such a logic circuit. However, under the node fault mode, all observed failures on the signal can be explaned. With reference to FIG. 2, consider a logic signal line 46 that connect two logic gates 48 and 50. On each simulation cycle, the logic errors on the circuit outputs caused by a 0/1 error at a node A are recorded in a set $S_1$. Similarly, the 1/0 error at node A is captured in a set $S_2$. A diagnostic signature set S for node A is then computed as the union of $S_1$ and $S_2$. The diagnostic signature set S captures all possible erroneous outputs in the presence of an open fault on node A. Note that not all outputs in the set S will actually be faulty in the presence of an open fault on node A, but rather the set S comprises an upper bound on the faulty behavior of an open fault and can be relatively easily determined by modifying standard logic and fault simulation techniques without the need for parasitic capacitance information or circuit (transistor) level simulation. This represents a major innovation in the diagnostic fault model.

The net model covers open defects on interconnects with moderate to large interconnect fanouts. An open defect on an interconnect with fanout can affect a subset of the branches. Thus, neither a stuck-at fault on the stem nor a stuck-at fault on the branches may explain all of the observed failures. The net model is constructed by taking a union of the stuck-at signatures on the stem and the branches. For example, with reference to FIG. 3, a circuit is depicted comprising logic gates 52, 54, and 56, connected by an interconnect 58 comprising a stem 60, and two branches 62 and 64. A respective node B, C, and D is defined for each of stem 60 and branches 62 and 64. As with the foregoing case, a 0/1 or 1/0 error may be present at each of nodes B, C, and D, resulting in sets $S_1$ and $S_2$ for node B, sets $S_3$ and $S_4$ for node C, and sets $S_5$ and $S_6$ for node D. In this instance, the diagnostic signature set S comprises a union of all of the possible erroneous outputs that might occur in the presence of an open fault at any of nodes B, C, or D on interconnect 58, i.e., the union of the sets $S_1$, $S_2$, $S_3$, $S_4$, $S_5$, and $S_6$.

Figure 4:
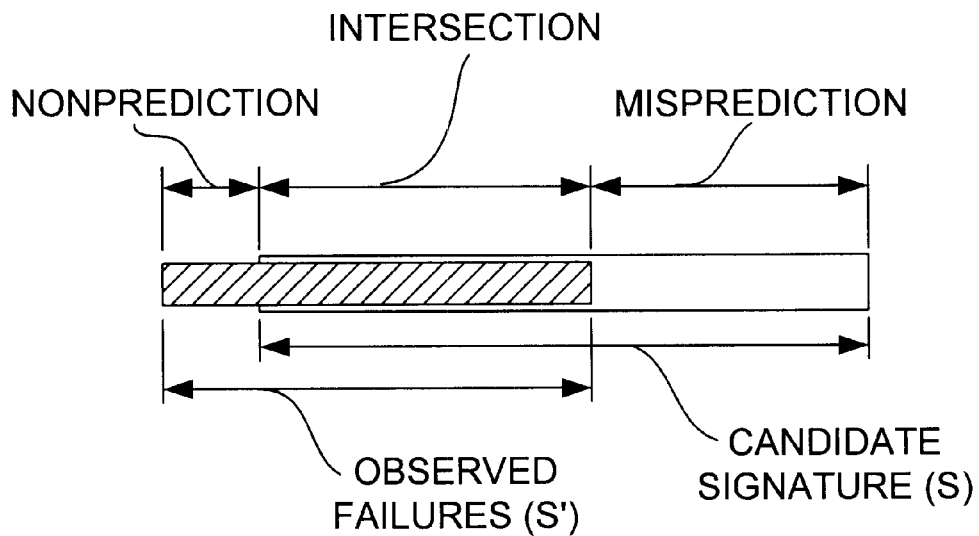
FIG. 4 is a pictorial representation of the diagnostic matching algorithm implemented by the present invention.

Once the diagnostic signature set S is computed for all interconnects of interest in the logic circuit, a diagnostic matching algorithm is used to determine the actual faulty interconnect, as is now described with reference to FIG. 4. The diagnostic signature set S is compared with a set of logic failures observed during actual testing of the logic circuit. For example, it is common to perform automatic test pattern generation (ATPG) testing to determine logic errors in semiconductor devices. The actual observed failures, which comprise a set S', will comprise a subset of the diagnostic signature S computed for the actual faulty interconnect. The relationship between the sets S' and S is depicted in FIG. 4, wherein an intersection is defined as S'∩S, a nonprediction as S'–S and a misprediction as S–S'. If there is any nonprediction on an interconnect, then that interconnect can be ruled out from consideration. However, mispredictions are tolerated since the set S represents an upper bound on all possible failures due to an open interconnect. Thus, the actual faulty interconnect(s) can be diagnosed by picking all interconnects that have null nonprediction and then picking the one(s) that has minimum misprediction.

Figure 5:
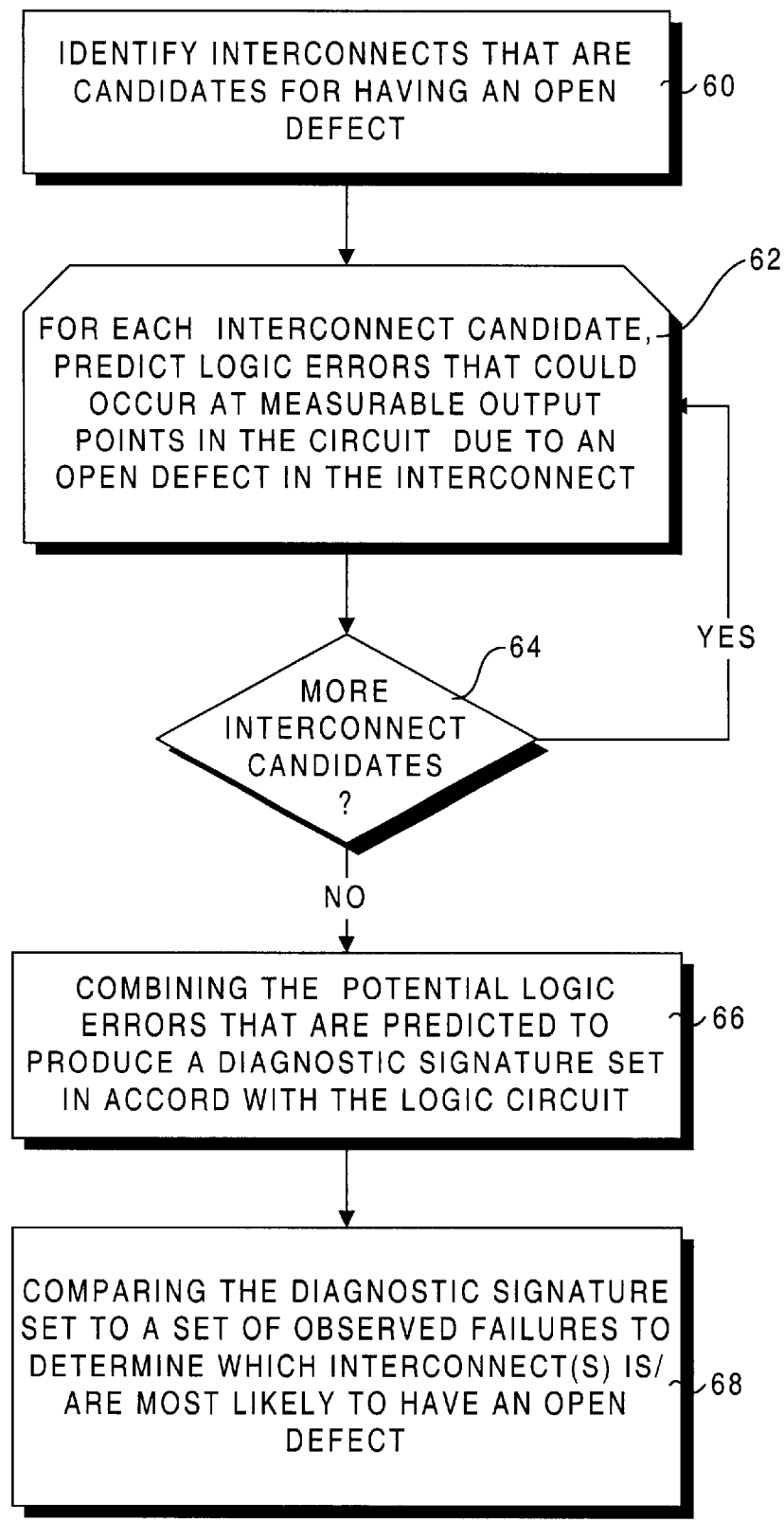
FIG. 5 is a logic flowchart illustrating the logic used by the present invention in determining the interconnect(s) that are mostly likely to have an open defect.

A logic flow diagram corresponding to the foregoing diagnostic process is illustrated in FIG. 5. The process begins in a block 60, in which logic circuit interconnects that are candidates for having an open defect are identified. The logic then flows to a loop start block 62, in which logic errors that could occur (i.e., potential logic errors) at measurable output points in the logic circuit (e.g., output pads and internal observation points) due to an open fault in an interconnect candidate are predicted. In accord with a decision block 64, similar logic errors are predicted for each interconnect candidate until all of the interconnect candidates are evaluated. As provided by a block 66, the potential logic errors are then combined to produce a diagnostic signature set for the interconnect candidates of the logic circuit. This diagnostic signature set is then compared with a set of actual failures observed during testing (e.g., through use of ATPG) of the logic circuit to determine the interconnect or interconnects that are most likely to have an open defect, based on the diagnostic matching algorithm discussed above. For example, given a diagnostic signature set and an observed failure set, the most likely interconnect to have an open fault will be the interconnect that has the minimum level of misprediction.

Exemplary System for Implementing the Invention

Figure 6:
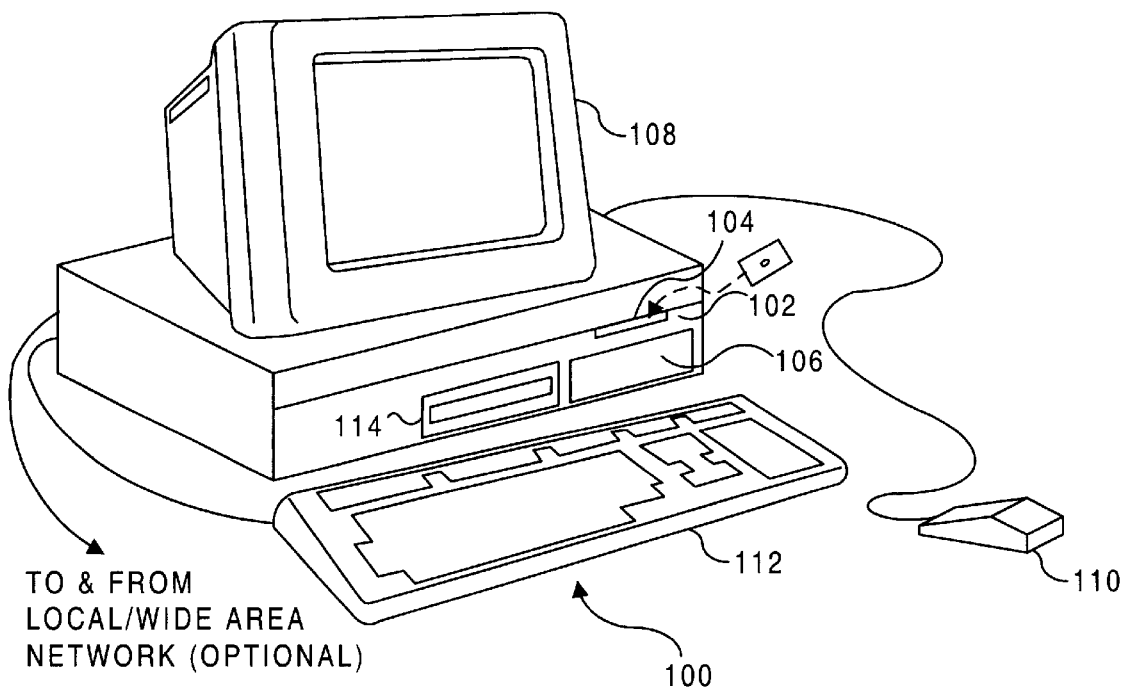
FIG. 6 is a schematic diagram of an exemplary system for implementing the present invention.

With reference to FIG. 6, a generally conventional personal computer 100 is illustrated, which is suitable for use in connection with practicing the present invention. Alternatively, a corresponding workstation on a local area network may be used for executing machine instructions comprising a computer program that causes the present invention to be executed. Personal computer 100 includes a processor chassis 102 in which are mounted a floppy disk drive 104, a hard drive 106, a motherboard populated with appropriate integrated circuits (not shown), and a power supply (also not shown), as are generally well known to those of ordinary skill in the art. A monitor 108 is included for displaying graphics and text generated by software programs that are run by the personal computer, and for graphically representing models of objects produced by the present invention. A mouse 110 (or other pointing device) is connected to a serial port (or to a bus port) on the rear of processor chassis 102, and signals from mouse 110 are conveyed to the motherboard to control a cursor on the display and to select text, menu options, and graphic components displayed on monitor 108 by software programs executing on the personal computer. In addition, a keyboard 112 is coupled to the motherboard for user entry of text and commands that affect the running of software programs executing on the personal computer.

Personal computer 100 also optionally includes a compact disk-read only memory (CD-ROM) drive 114 into which a CD-ROM disk may be inserted so that executable files and data on the disk can be read for transfer into the memory and/or into storage on hard drive 106 of personal computer 100. Other mass memory storage devices such as an optical recorded medium or DVD drive may be included. The machine instructions comprising the software program that causes the CPU to implement the functions of the present invention that have been discussed above will likely be distributed on floppy disks or CD-ROMs (or other memory media) and stored in the hard drive until loaded into random access memory (RAM) for execution by the CPU.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. Accordingly, it is not intended that the scope of the invention in any way be limited by the above description, but instead be determined entirely by reference to the claims that follow.

What is claimed is:

1. A method for diagnosing open defects in a logic circuit comprising a plurality of logic components connect by a plurality of interconnects, the method comprising:

identifying interconnect candidates that might have an open defect from among said plurality of interconnects;

for each interconnect candidate, predicting logic errors that could occur at one or more output points in the logic circuit due to an open defect in the interconnect;

combining the logic errors that are predicted for each interconnect candidate to produce a diagnostic signature set S corresponding to the logic circuit;

comparing the diagnostic signature set S to a set of logic failures S' observed at said one or more output points during testing of the logic circuit to determine which interconnect(s) is/are most likely to have an open defect.

2. The method of claim 1, wherein the interconnect candidates that are most likely to have an open defect are determined as a function of a level of misprediction for each interconnect candidate, wherein the level of misprediction for each interconnect candidate is determined from S–S'.

3. The method of claim 1, wherein at least one of the plurality of interconnects comprise a signal line connecting a pair of logic gates, and wherein logical error's at said one or more output points in the logic circuit corresponding to such an interconnect are predicted by considering potential errors at said one or more output points due to the presence of stuck-at-0 and a stuck-at-1 faults on the signal line.

4. The method of claim 1, wherein at least one of the plurality of interconnects comprises a stem portion connects to a plurality of branch portions, and wherein logical errors at said one or more output points in the logic circuit corresponding to such an interconnect are predicted by considering the union of potential errors at said one or more output points due to the presence of stuck-at-0 and stuck-at-1 faults on each of the stem portions and the plurality of branch portions of the interconnect.

5. The method of claim 1, wherein the logic circuit comprises an integrated circuit including bond pads, and said one or more output points comprise at least one bond pad.

6. The method of claim 1, wherein the logic circuit comprises an integrated circuit, and said one or more output points comprise at least one of a scan node, scanout node, and/or memory array within the integrated circuit.

7. Apparatus for diagnosing open defects in a logic circuit comprising a plurality of logic components connect by a plurality of interconnects, comprising:

a memory in which data corresponding to logic failures observed during testing of the logic circuit and machine instructions comprising a computer program are stored; and a processor coupled to the memory for executing the machine instructions comprising the computer program, said processor implementing a plurality of functions when executing the machine instructions, including:

identifying interconnect candidates that might have an open defect from among the plurality of interconnects;

for each interconnect candidate, determining logic errors that could occur at one or more output points in the logic circuit due to an open defect in the interconnect;

combining the logic errors that are determined for each interconnect candidate to produce a diagnostic signature set S corresponding to the logic circuit;

comparing the diagnostic signature set S to a set of logic failures S' observed at said one or more output points during testing of the logic circuit to determine which interconnect(s) is/are most likely to have an open defect.

8. The apparatus of claim 7, wherein the interconnect candidates that are most likely to have an open defect are determined as a function of a level of misprediction for each interconnect candidate, wherein the level of misprediction for each interconnect candidate is determined from S–S'.

9. The apparatus of claim 7, wherein at least one of said plurality of interconnects comprise as ignal line connecting a pair of logic gates, and wherein logical errors at said one or more output points in the logic circuit corresponding to such an interconnect are predicted by considering potential errors at said one or more output points due to the presence of stuck-at-0 and a stuck-at-1 faults on the signal line.

10. The apparatus of claim 7, wherein at least one of said plurality of interconnects comprises a stem portion connected to a plurality of branch portions, and wherein logical errors at said one or more output points in the logic circuit corresponding to such an interconnect are predicted by considering the union of potential errors at said one or more output points due to the presence of stuck-at-0 and stuck-at-1 faults on each of the stem portions and the plurality of branch portions of the interconnect.

11. The apparatus of claim 7, wherein the logic circuit comprises an integrated circuit including bond pads, and said one or more output points comprise at least one bond pad.

12. The apparatus of claim 7, wherein the logic circuit comprises an integrated circuit, and said one or more output points comprise at least one of a scan node, scanout node, and/or memory array within the integrated circuit.

13. An article of manufacture for use diagnosing open defects in a logic circuit comprising a plurality of logic components connect by a plurality of interconnects, comprising:

a memory media adapted to be used with a computer; and a plurality of machine instructions stored on the memory media, said machine instructions effecting a plurality of functions when executed by the computer, including:

identifying interconnect candidates that might have an open defect from among said plurality of interconnects;

for each interconnect candidate, determining logic errors that could occur at one or more output points in the logic circuit due to an open defect;

combining the logic errors that are determined for each interconnect candidate to produce a diagnostic signature set S corresponding to the logic circuit;

comparing the diagnostic signature set S to a set of logic failures S' observed during testing of the logic circuit to determine which interconnect(s) is/are most likely to have an open defect.

14. The article of manufacture of claim 13, wherein the interconnect candidates that are most likely to have an open defect are determined as a function of a level of misprediction for each interconnect candidate, wherein the level of misprediction for each interconnect candidate is determined from S–S'.

15. The article of manufacture of claim 13, wherein at least one of said plurality of interconnects comprise a signal line connecting a pair of logic gates, and wherein logical errors at said one or more output points in the logic circuit corresponding to such an interconnect are predicted by considering potential errors at said one or more output points due to the presence of stuck-at-0 and a stuck-at-1 faults on the signal line.

16. The article of manufacture of claim 13, wherein at least one of said plurality of interconnects comprises a stem portion connected to a plurality of branch portions, and wherein logical errors at said one or more output points in the logic circuit corresponding to such an interconnect are predicted by considering the union of potential errors at said one or more output points due to the presence of stuck-at-0 and stuck-at-1 faults on each of the stem portions and the plurality of branch portions of the interconnect.

17. The article of manufacture of claim 13, wherein the logic circuit comprises an integrated circuit including bond pads, and said one or more output points comprise at least one bond pad.

18. The article of manufacture of claim 13, wherein the logic circuit comprises an integrated circuit, and said one or more output points comprise at least one of a scan node, scanout node, and/or memory array within the integrated circuit.

* * * * *